United States Patent
Walling et al.

(10) Patent No.: US 6,876,689 B2
(45) Date of Patent: Apr. 5, 2005

(54) NARROW SPECTRAL BANDWIDTH TUNABLE PULSED SOLID-STATE LASER SYSTEM

(75) Inventors: John Curtis Walling, Whitehouse Station, NJ (US); Donald F. Heller, Bound Brook, NJ (US)

(73) Assignee: Light Age, Inc., Somerset, NJ (US)

( * ) Notice: Subject to any disclaimer, the term of this patent is extended or adjusted under 35 U.S.C. 154(b) by 0 days.

(21) Appl. No.: 09/876,678

(22) Filed: Jun. 7, 2001

(65) Prior Publication Data

US 2002/0185701 A1 Dec. 12, 2002

(51) Int. Cl.[7] .............................................. H01S 3/083
(52) U.S. Cl. .......................... 372/94; 372/93; 372/18; 372/70; 372/72
(58) Field of Search ............................ 372/18, 70, 72, 372/93, 94, 32, 71, 57, 96

(56) References Cited

U.S. PATENT DOCUMENTS

| | | | | |
|---|---|---|---|---|
| 5,164,954 A | * | 11/1992 | Su | 372/20 |
| 5,172,382 A | * | 12/1992 | Loh et al. | 372/106 |
| 5,243,610 A | * | 9/1993 | Murata | 359/328 |
| 5,251,230 A | * | 10/1993 | Lai et al. | 372/12 |
| 5,260,953 A | * | 11/1993 | Rowe | 372/105 |
| 5,307,358 A | * | 4/1994 | Scheps | 372/20 |
| 5,349,598 A | * | 9/1994 | Ouchi et al. | 372/26 |
| 5,442,442 A | * | 8/1995 | Kanegsberg et al. | 356/473 |
| 5,673,281 A | * | 9/1997 | Byer | 372/10 |
| 6,009,114 A | * | 12/1999 | Heller et al. | 372/70 |
| 6,173,000 B1 | * | 1/2001 | Balla | 372/100 |

* cited by examiner

*Primary Examiner*—Tom Thomas
*Assistant Examiner*—Matthew C Landau
(74) *Attorney, Agent, or Firm*—Greenberg Traurig LLP; Eugene C. Rzucidlo

(57) ABSTRACT

A tunable solid-state laser system whose bandwidth and wavelength are controlled by the injection of light from a semiconductor diode laser. This laser system is capable of providing output light pulses over substantially all wavelength ranges in the electromagnetic spectrum. When suitably configured, it creates wavelength tunable (or fixed wavelength) pulses having spectral bandwidths that are Fourier transform limited and wavelength stabilized. The coupling means between the semiconductor diode laser and the ring laser cavity incorporates a means for optically isolating the diode laser source from optical feedback from the ring laser, ensuring diode laser source stability.

19 Claims, 1 Drawing Sheet

DIAGRAM OF AMPLIFIED, NARROW BANDWIDTH, UV LASER SYSTEM

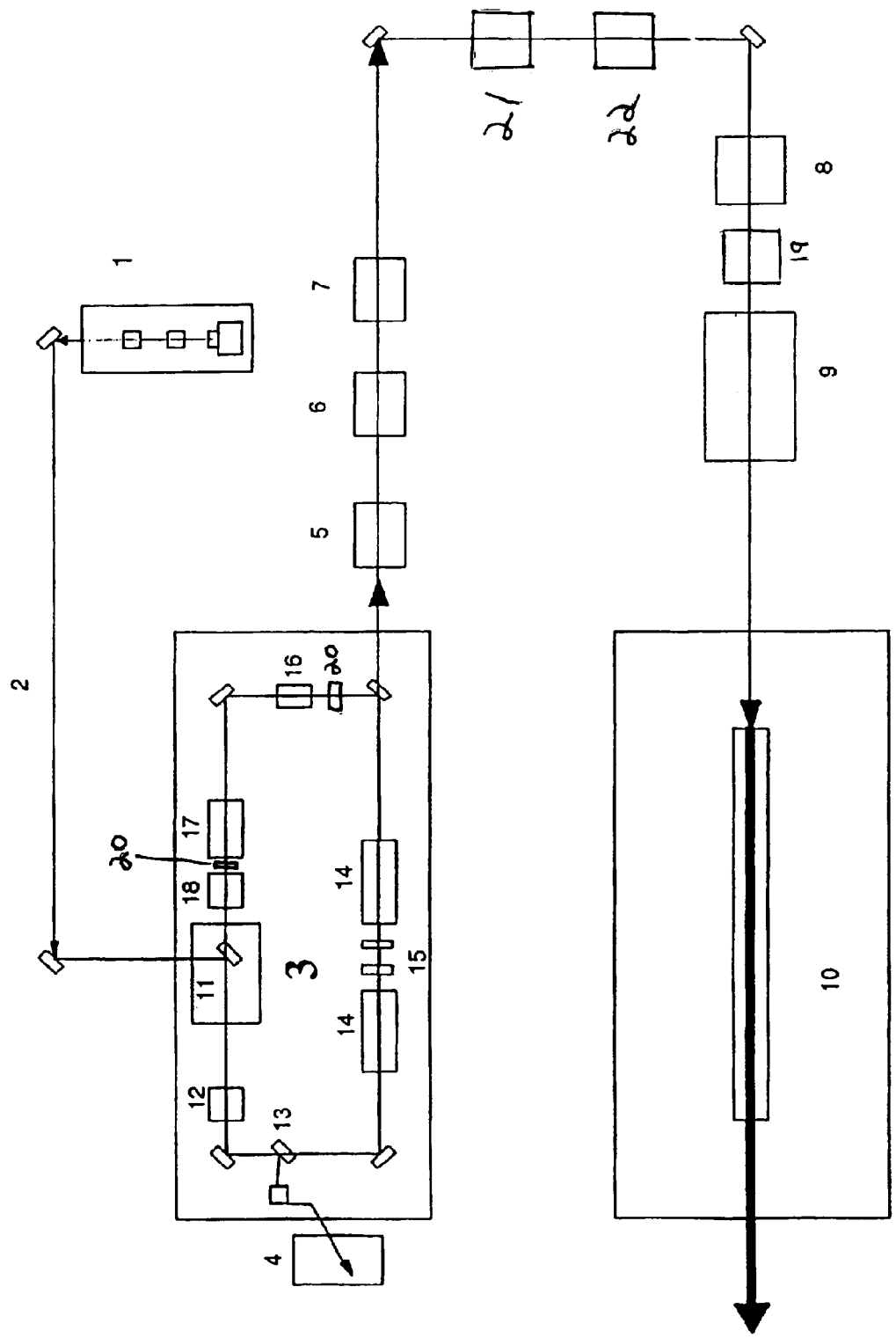
FIGURE 1: DIAGRAM OF AMPLIFIED, NARROW BANDWIDTH, UV LASER SYSTEM

NARROW SPECTRAL BANDWIDTH TUNABLE PULSED SOLID-STATE LASER SYSTEM

BACKGROUND OF THE INVENTION

1. Field of the Invention

This invention deals with laser systems, and more specifically with a tunable solid-state laser system whose bandwidth and wavelength are controlled by the injection of light from a semiconductor diode laser.

2. Description of the Prior Art

Diode laser injection seeding (DLIS), a method for controlling the wavelength and spectral bandwidth of relatively high power (e.g., megawatt) pulsed solid state lasers using light from very low intensity precisely controlled semiconductor diode laser sources, was invented in the early 1980s by Donald F. Heller. DLIS was reduced to practice in 1983–1985 first using standing wave alexandrite laser systems and later using alexandrite ring resonator systems. An article based on this work and describing the basic physics of the underlying phenomena, entitled "Injection Locking Broadly Tunable Alexandrite Lasers Using Semiconductor Laser Diodes," by J. Krasinski, P. Papanestor, J. A. Pete, and D. F. Heller, was published in Tunable Solid-State Lasers II (Proceedings of the OSA Topical Meeting, Rippling River Resort, Zigzag, Oreg., Jun. 4–6, 1986), A. B. Budgor, L. Esterowitz, L. G. DeShazer, eds., Springer-Verlag (New York), 1986.

Work was later continued and extended to more refined ring laser systems for use in lidar experiments by the inventors in collaboration with researchers at the University of Bonn and Rostock and later Utah State University during the period of 1989 trough 1995. Much of this work was described in a publication, entitled "Alexandrite Lasers for Temperature Sounding of the Sodium Layer," by Stephan Schmitz, Ulf von Zahn, John C. Walling, and Don Heller, Proceedings of the 12$^{th}$ ESA Symposium on Rocket and Balloon Programmers and Related Research, Lillehammer, Norway, 1995.

The basic invention was substantially improved by active cavity length stabilization and the development of an intracavity modulator, the use of an external cavity semiconductor diode laser source, and the development of means to convert the output of the narrow band pulsed alexandrite laser into the ultraviolet and deep ultraviolet, using newly developed harmonic generation materials and methods that preserve the spectral fidelity of the light output. Important wavelengths at 248 nm, and especially at 193 nm, that are coincident with gain of krypton fluoride (KrF) and argon fluoride (ArF) excimer lasers were generated by these techniques. This has provided very narrow bandwidth light at these wavelengths for the first time and provides the opportunity for using the injection seeded solid state lasers as sources to sweep the gain from excimer laser amplifiers to provide important new tools for spectroscopy, photochemistry, and UV interferometry and photolithography.

A well-known problem in UV photolithography is the requirement for very narrow band laser sources in order to overcome the increasing optical dispersion that reduces the ability to tightly focus or critically image light at short wavelengths. These narrow bandwidth UV laser sources are also needed as sources for optical interferometry and metrology which are used to fabricate devices and instruments used in the production of high density semiconductor devices for the electronics industry.

SUMMARY OF THE INVENTION

We disclose the invention of a tunable solid-state laser system whose bandwidth and wavelength are controlled by the injection of light from a semiconductor diode laser. This laser system is capable of providing output light pulses over substantially all wavelength ranges in the infrared, ultraviolet, and visible spectrum. When suitably configured, it creates wavelength tunable or fixed wavelength pulses having spectral bandwidths that are Fourier transform limited and wavelength stabilized. This invention is useful for providing laser light sources for detecting and monitoring atmospheric pollutants and trace elements; laboratory spectroscopy; optical interferometry; laser metrology; holography; and high resolution photolithography, especially at 248 nm and 193 nm wavelengths.

BRIEF DESCRIPTION OF THE DRAWINGS

FIG. 1 is a diagram of an amplified, narrow bandwidth UV laser system.

DETAILED DESCRIPTION OF THE DRAWINGS

The basic invention comprises a diode laser injection seeded, cavity length stabilized ring laser including elements and optional elements described below.

There is depicted in FIG. 1 a semiconductor diode laser source 1, such source being preferably a continuous wave (cw) external cavity or distributed feedback (DFB) semiconductor diode laser. Such a semiconductor diode laser source has the important properties of very narrow spectral bandwidth, preferably 10 MHz or less, and tunability without mode-hopping over a frequency range of at least a few gigahertz (GHz) and preferably several nanometers within a wavelength range of 700 nm and 1000 nm, most preferably between 710 nm and 850 nm.

Also depicted in FIG. 1 is a ring laser optical resonator cavity 3 incorporating a tunable solid-state laser material, preferably alexandrite, chromium lithium calcium aluminum fluoride (LiCAF), or titanium sapphire. Incorporated into the ring laser optical resonator cavity 3 is an injection coupler 11 to align the injected beam with the resonator 3; a pockels cell or Q-Switch 12 discharged or fired when the optical length of the cavity 3 is such that the injected semiconductor diode laser light is resonant with a laser cavity mode; a beam pick-off 13 for cavity length stabilization, said pick-off 13 coupled to cavity length stabilization electronics 4 to ensure resonance with the frequency of the injection source; a plurality of pump chambers 14 containing laser rods, preferably made of alexandrite; a polarization rotator and compensating lens 15; a faraday rotator and waveplate 16 and an optical modulator 17 acting as a means for optically isolating the diode laser source 1 from any optical feedback from said ring laser 3; and a birefringent tuning device 18 with optional etalons.

The ring laser optical resonator cavity 3 is injected with the light from the semiconductor diode laser source 1. There is shown a means 2 for coupling the light emitted by the semiconductor diode laser source 1 into the ring laser resonator 3 of the pulsed laser. This means 2 is preferably a mirror or a fiberoptic system incorporating a means for optically isolating the diode laser source 1 from any optical feedback from said ring laser 3. An example of such an isolation means is the optical isolator 17 and faraday rotator 16 sandwiched between the two suitably oriented polarizers 20 to be found within the ring laser cavity. Without proper isolation, small amounts of light can escape back to the semiconductor diode laser 1, causing the source 1 to behave erratically.

FIG. 1 also depicts optional intra- and/or extra-cavity nonlinear elements for converting the output wavelength of the laser system to wavelengths that are either longer or shorter than the fundamental wavelength resonant with the ring laser injection seeded oscillator 3. Such elements include, but are not limited to, a second harmonic generator crystal 5; a third harmonic generator for KrF injection 6; a fourth harmonic generator for ArF injection 7, or other nonlinear sum or difference frequency generators 21. While less desirable, optical parametric oscillators 22 and solid, liquid, or gas phase raman converters 19 may also be used to convert the wavelength of the fundamental light output of the injection seeded ring laser. However, these devices often broaden the spectral bandwidth of the light output and reduce its stability.

Optionally, the laser system may incorporate an excimer laser amplifier 10 that includes a discharge tube filled with a gaseous mixture of krypton or argon gas and any of a number of fluorine-containing molecules. KrF and ArF gas discharge provide net optical gain at wavelengths proximate to 248 nm and/or 193 nm. This amplifier 10 is connected to the second harmonic generator 6 and the third harmonic generator 7 through an optional optical isolator 8 and a telescope 9. Such a laser amplifier 10 is easily obtained by removing the mirrors from a commercially available excimer laser oscillator.

While the present invention has been described in connection with exemplary embodiments thereof, it will be understood that many modifications in both design and use will be apparent to those of ordinary skill in the art; and this application is intended to cover any adaptations or variations thereof. Therefore, it is manifestly intended that this invention be limited only by the claims and the equivalents thereof.

What is claimed is:

1. A diode laser injection seeded, cavity length stabilized ring laser, comprising:
    a semiconductor diode laser source;
    a ring laser optical resonator cavity containing a tunable solid-state gain material, said gain material having optical gain at the frequency of the diode laser source; and
    means for coupling a light beam from the diode laser source into said optical resonator cavity wherein the optical resonator cavity incorporates a tunable solid-state laser material and is injected with the light beam from said semiconductor diode laser;
    and wherein said optical resonator comprises:
      i) an injection coupler to introduce the diode laser beam into the optical resonator cavity and align it with the resonant modes of the cavity;
      ii) at least one pump chamber containing the tunable solid-state gain material and means for optically pumping said gain material;
      iii) a pockels cell; and
      iv) a wavelength selection device, said device comprising a birefringent tuner or an etalon.

2. The ring laser of claim 1, wherein the diode laser is an external cavity tunable semiconductor diode laser.

3. The ring laser of claim 1, wherein the diode laser source is a distributed feedback semiconductor diode laser.

4. The ring laser of claim 1, wherein the means for coupling the light beam into the ring laser optical resonator comprises:
    a coupling device that directs some portion of the diode laser beam into the optical resonator, said device including a coupling mirror or a polarizer.

5. The ring laser of claim 4, wherein a means for optically isolating the diode laser source from the optical feedback from the ring laser comprises a faraday rotator sandwiched between two suitably oriented polarizers.

6. The ring laser of claim 1 wherein the tunable solid-state laser material is selected from the group consisting of alexandrite, chromium doped lithium calcium aluminum fluoride, chromium doped lithium strontium aluminum fluoride, and titanium doped sapphire.

7. The ring laser of claim 6, wherein the means to insure that one mode of the ring laser optical resonator is in resonance with the frequency of the injected diode laser source comprises a beam pick-off and a photodetector, and electronic circuitry that discharges or fires the pockels cell when the optical length of the cavity is such that the injected semiconductor laser light is resonant with a laser cavity mode.

8. The ring laser of claim 1 further comprising one or more intra- and/or extra-cavity nonlinear elements for converting the output of said laser to wavelengths that are either longer or shorter than the fundamental wavelength that is emitted by the ring laser.

9. The ring laser system of claim 8, wherein the intra-cavity nonlinear element comprises harmonic generator crystals, nonlinear sum or difference generator crystals, optical parametric oscillators, and solid, liquid, or gas raman converters.

10. The ring laser system of claim 8, further comprising an excimer laser amplifier that includes a gaseous discharge tube.

11. The ring laser system of claim 10, wherein the gaseous discharge tube contains a gas mixture comprising electronically excited krypton fluoride or argon fluoride molecules as a component.

12. The ring laser system of claim 10 wherein the light exiting the nonlinear elements is conducted into said laser amplifier by conducting means comprised of a telescope.

13. The ring laser of claim 1, wherein the diode laser source has a spectral bandwidth of 10 MHz or less, and is tunable without mode-hopping over a wavelength range between 700 nm and 1000 nm.

14. The ring layer of claim 13, wherein the diode laser source is tunable over a wavelength range between 710 and 850 nm.

15. The ring laser of claim 8, wherein the extra-cavity non-linear element comprises harmonic generator crystals, nonlinear sum or difference frequency generators, optical parametric oscillators, and solid, liquid, or gas phase raman converters.

16. The ring laser of claim 1 wherein the cavity length stabilized ring laser comprises a means to insure that one mode of the ring laser optical resonator is in resonance with the frequency of the injected diode laser source.

17. The ring laser of claim 1, wherein the optical resonator cavity further comprises:
    at least one polarization compensation device, said polarization compensation device including a waveplate or a polarization rotator;
    at least one optical modulator; and
    at least one lens.

18. The ring laser of claim 4, wherein the means for coupling further comprises a means for optically isolating the diode laser source from optical feedback from the ring laser and a fiberoptic means for conveying diode laser beam to the coupling device.

19. The ring laser system of claim 12 wherein the conducting means further comprise a telescope and optical isolators.

* * * * *